(12) United States Patent
Jeon et al.

(10) Patent No.: US 11,063,068 B2
(45) Date of Patent: Jul. 13, 2021

(54) DISPLAY APPARATUS

(71) Applicant: LG Display Co., Ltd., Seoul (KR)

(72) Inventors: JinChae Jeon, Paju-si (KR); SoYoung Noh, Goyang-si (KR); UiJin Chung, Goyang-si (KR); Eunsung Kim, Goyang-si (KR); HyunSoo Shin, Paju-si (KR); Wonkyung Kim, Busan (KR); Jeihyun Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/575,917

(22) Filed: Sep. 19, 2019

(65) Prior Publication Data
US 2020/0144309 A1 May 7, 2020

(30) Foreign Application Priority Data

Nov. 7, 2018 (KR) .......................... 10-2018-0136203

(51) Int. Cl.
*H01L 27/12* (2006.01)

(52) U.S. Cl.
CPC ...... *H01L 27/1255* (2013.01); *H01L 27/1222* (2013.01); *H01L 27/1248* (2013.01)

(58) Field of Classification Search
CPC ............. H01L 27/1255; H01L 27/1248; H01L 27/1222; H01L 27/1218; H01L 27/1225; H01L 27/3244; H01L 27/1214; G02F 1/1368
See application file for complete search history.

(56) References Cited

U.S. PATENT DOCUMENTS

| 2009/0315457 A1 | 12/2009 | Furukawa et al. |
| 2012/0097967 A1* | 4/2012 | Choi ................... H01L 27/3262 257/72 |
| 2015/0055051 A1 | 2/2015 | Osawa et al. |

(Continued)

FOREIGN PATENT DOCUMENTS

| CN | 108198862 A | 6/2018 |
| EP | 1 245 996 A1 | 10/2002 |

(Continued)

OTHER PUBLICATIONS

Combined Search and Examination Report dated Apr. 14, 2020, issued in corresponding UK Patent Application No. GB1916211.4.

(Continued)

*Primary Examiner* — Matthew L Reames
(74) *Attorney, Agent, or Firm* — Morgan, Lewis & Bockius LLP

(57) ABSTRACT

A display apparatus includes a substrate having a first substrate, a second substrate, and an inorganic insulating layer between the first substrate and the second substrate. A first buffer layer is on the substrate, wherein the first buffer layer includes n+1 layers, and 'n' is 0 or an even number. A first thin film transistor, a second thin film transistor, and a storage capacitor are each on the first buffer layer. The first thin film transistor includes a first active layer formed of a low temperature poly silicon material. The second thin film transistor includes a second active layer formed of an oxide semiconductor material. The storage capacitor includes a first capacitor electrode and a second capacitor electrode.

23 Claims, 5 Drawing Sheets

(56) References Cited

U.S. PATENT DOCUMENTS

| | | | |
|---|---|---|---|
| 2015/0263007 A1* | 9/2015 | Yamazaki | ......... H01L 29/78648 257/43 |
| 2016/0064421 A1 | 3/2016 | Oh et al. | |
| 2016/0087022 A1 | 3/2016 | Tsai et al. | |
| 2017/0033133 A1 | 2/2017 | Makita et al. | |
| 2017/0155000 A1 | 6/2017 | Moon et al. | |
| 2017/0278916 A1 | 9/2017 | Muruyama | |
| 2018/0012947 A1 | 1/2018 | Lee et al. | |
| 2018/0061868 A1 | 3/2018 | Na et al. | |
| 2018/0151654 A1 | 5/2018 | Lee | |
| 2018/0277614 A1* | 9/2018 | Ono | ................... H01L 27/3258 |

FOREIGN PATENT DOCUMENTS

| | | |
|---|---|---|
| EP | 2 871 685 A2 | 5/2015 |
| EP | 2 985 784 A1 | 2/2016 |
| EP | 3 270 417 A1 | 1/2018 |
| EP | 3 331 023 A1 | 6/2018 |
| EP | 3 343 616 A1 | 7/2018 |
| JP | 2010-010186 A | 1/2010 |
| JP | 2017-536646 A | 12/2017 |
| JP | 2018-117154 A | 7/2018 |
| KR | 10-2016-0043327 A | 4/2016 |
| TW | 201523889 A | 6/2015 |
| WO | 2012/144499 A1 | 10/2012 |

OTHER PUBLICATIONS

Office Action and Search Report dated Jul. 17, 2020, issued in corresponding Taiwanese Patent Application No. 10920677900.

First Examination Report dated Mar. 31, 2021, issued in corresponding Indian Patent Application No. 201914044181.

Notice of Reasons for Refusal dated Nov. 17, 2020, issued in corresponding Japanese Patent Application No. 2019-186586.

Examination Report dated Dec. 18, 2020, issued in corresponding UK Patent Application No. GB1916211.4.

Office Action dated Dec. 3, 2020, issued in corresponding Taiwanese Patent Application No. 108129006.

* cited by examiner

DISPLAY APPARATUS

CROSS-REFERENCE TO RELATED APPLICATIONS

This application claims the priority of Korean Patent Application No. 10-2018-0136203 filed on Nov. 7, 2018, in the Korean Intellectual Property Office, the disclosure of which is incorporated herein by reference in its entirety.

BACKGROUND

Technical Field

The present disclosure relates to a display apparatus, and more particularly, to a display apparatus in which a plurality of thin film transistors is formed with different semiconductors.

Description of the Related Art

As information technology has developed, a display apparatus has been developed that can represent information contained in an electrical information signals in the form of visual images. Various types of display apparatuses have been developed, some of which have excellent performance characteristics such as thinness, light weight, and/or low power consumption.

Examples of display apparatuses include a liquid crystal display apparatus (LCD) and an electroluminescence display apparatus, such as an organic light emitting display apparatus (OLED) or a quantum-dot light emitting display apparatus (QLED). The electroluminescence display apparatus may be a next-generation display apparatus having a self-emitting characteristic, and may have excellent characteristics in terms of viewing angle, contrast, response speed, and power consumption, as compared with a liquid crystal display apparatus.

An electroluminescence display apparatus may include a display area for displaying images and a non-display area disposed to be adjacent to the display area. A pixel area, which may be disposed in the display area, may include a pixel circuit and a light emitting element. In the pixel circuit, a plurality of thin film transistors may be disposed to drive the light emitting elements.

Thin film transistors may be classified depending on a material used for a semiconductor layer. Among them, a low temperature poly silicon (LTPS) thin film transistor and an oxide semiconductor thin film transistor are most widely used. A technology for an electroluminescence display apparatus in which an LTPS thin film transistor and an oxide semiconductor thin film transistor are formed on the same substrate is actively being developed.

SUMMARY

Accordingly, embodiments of the present disclosure are directed to a display apparatus that substantially obviates one or more problems due to limitations and disadvantages of the related art.

The inventors of the present disclosure recognized that in the manufacturing method of a display apparatus, when the plurality of thin film transistors is formed with different semiconductors, operation characteristics of the pixels can be improved.

Therefore, the inventors of the present disclosure invented a display apparatus in which semiconductors of the plurality of thin film transistors may be formed on different layers to form the plurality of thin film transistors with different semiconductors. Also, damage to the semiconductor elements may be reduced.

Therefore, an object of the present disclosure is to provide a thin film transistor and a display apparatus which may reduce the damage to semiconductor elements during the manufacturing of the display apparatus caused by forming a plurality of thin film transistors with different semiconductor materials.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

According to an aspect of the present disclosure, a display apparatus includes a substrate including a first substrate, a second substrate, and an inorganic insulating layer between the first substrate and the second substrate; a first buffer layer on the substrate, wherein the first buffer layer includes n+1 layers, and 'n' is 0 or an even number; and a first thin film transistor, a second thin film transistor, and a storage capacitor each on the first buffer layer, wherein the first thin film transistor includes a first active layer formed of a low temperature poly silicon material, wherein the second thin film transistor includes a second active layer formed of an oxide semiconductor material, and wherein the storage capacitor includes a first capacitor electrode and a second capacitor electrode.

According to another aspect of the present disclosure, a display apparatus includes a substrate; a first buffer layer on the substrate; a first thin film transistor including: a first active layer formed of a low temperature poly silicon material, a first gate electrode overlapping the first active layer with a first gate insulating layer therebetween, and a first source electrode and a first drain electrode which are electrically connected to the first active layer; a second thin film transistor including: a second active layer formed of an oxide semiconductor, a second gate electrode overlapping the second active layer with a second gate insulating layer therebetween, and a second source electrode and a second drain electrode which are electrically connected to the second active layer; a storage capacitor including a first capacitor electrode on a same layer as the first gate electrode and a second capacitor electrode overlapping the first capacitor electrode with a first interlayer insulating layer therebetween; and a first blocking layer that is an extension of the second capacitor electrode which overlaps the second active layer.

According to another aspect of the present disclosure, a display apparatus includes a substrate; a first buffer layer on the substrate; a first thin film transistor including: a first active layer formed of a low temperature poly silicon material, a first gate electrode overlapping the first active layer with a first gate insulating layer therebetween, and a first source electrode and a first drain electrode which are electrically connected to the first active layer; a second thin film transistor including: a second active layer formed of an oxide semiconductor, a second gate electrode overlapping the second active layer with a second gate insulating layer therebetween, and a second source electrode and a second drain electrode which are electrically connected to the second active layer; a storage capacitor including a first capacitor electrode on a same layer as the first gate electrode and a second capacitor electrode overlapping the first capacitor electrode with a first interlayer insulating layer therebetween; and a first blocking layer that is an extension of the first capacitor electrode which overlaps the second active layer.

Other detailed matters of the example embodiments are included in the detailed description and the drawings.

According to embodiments of the present disclosure, thin film transistors including different semiconductor materials are disposed, thereby improving reliability of the display apparatus.

Further, according to embodiments of the present disclosure, an inorganic layer is formed between two polyimide (PI) to block charges charged in lower polyimide (PI), thereby improving the reliability of the product. Therefore, a process of forming a metal layer to block the charges charged in polyimide PI may be omitted, so that the process may be simplified and the production cost may be reduced.

Further, according to embodiments of the present disclosure, a blocking layer which is integrally formed to be connected to a capacitor electrode is disposed so as to overlap an active layer of the thin film transistor including an oxide semiconductor material, thereby suppressing hydrogen generated in a substrate from being diffused to an active layer. Further, a buffer layer disposed between the blocking layer and the active layer is formed as a multi-layer formed of an upper buffer layer having a relatively low hydrogen content and a lower buffer layer having a relatively high insulation property so that the upper buffer layer which is in contact with a lower surface of the active layer may suppress the hydrogen from being diffused to the active layer of the thin film transistor including the oxide semiconductor material. Further, the lower buffer layer disposed between the blocking layer and the upper buffer may suppress the charges charged in the blocking layer from being transmitted to the active layer of the thin film transistor.

The effects according to the present disclosure are not limited to the contents exemplified above, and more various effects are included in the present specification.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION OF THE EMBODIMENTS

Figure 1:
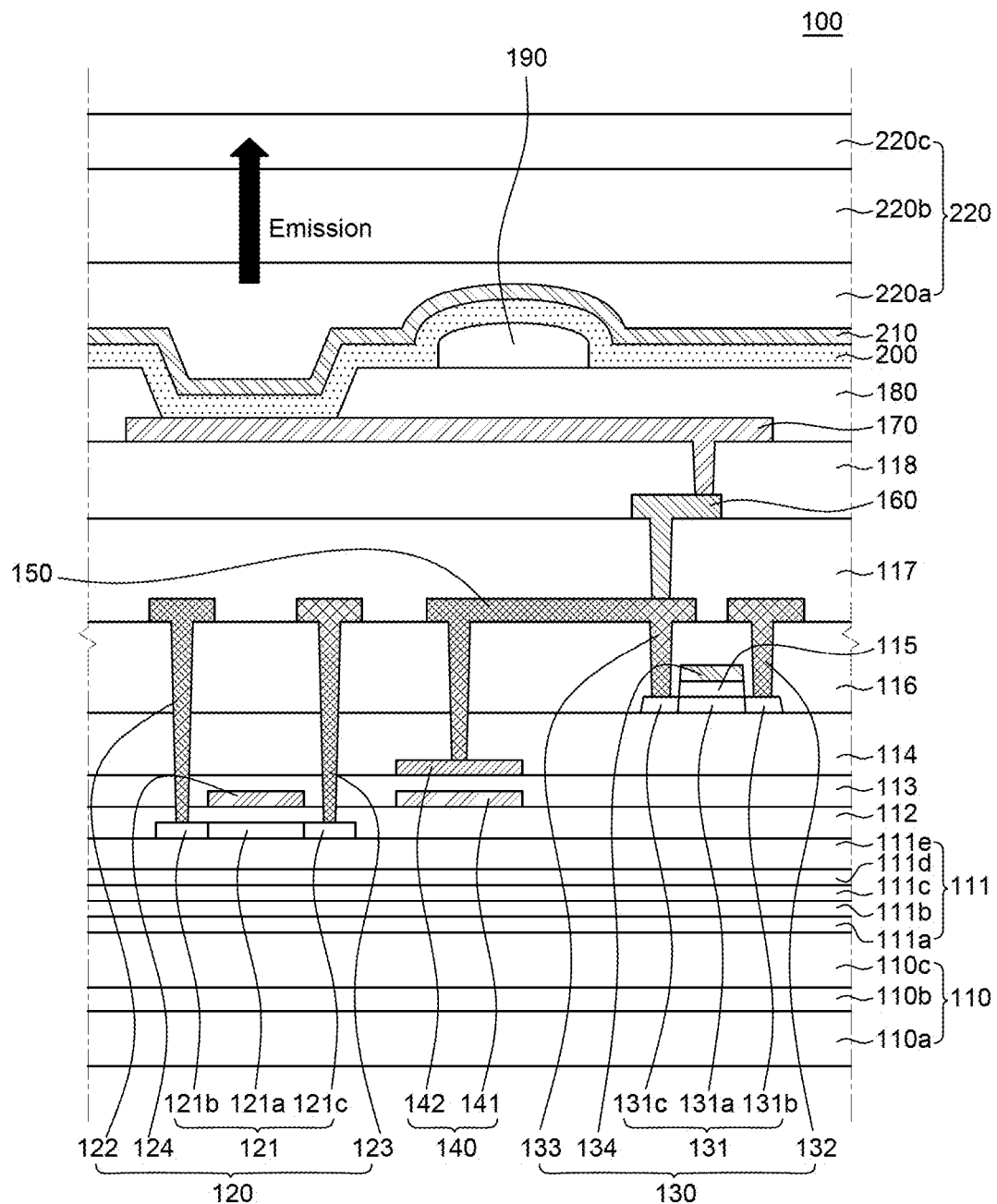
FIG. 1 is a cross-sectional view of a display apparatus according to an example embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly".

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings The display apparatus of the present disclosure may be applied to an electroluminescence display apparatus, such as an organic light emitting display apparatus (OLED) or a quantum-dot light emitting display apparatus (QLED), but is not limited thereto and may be applied to various display apparatuses. For example, the display apparatus of the present disclosure may also be applied to a liquid crystal display apparatus (LCD).

FIG. 1 is a cross-sectional view of a display apparatus according to an example embodiment of the present disclosure.

With reference to FIG. 1, a display apparatus 100 according to an example embodiment of the present disclosure includes a substrate 110, a first buffer layer 111, a first thin film transistor 120, a second thin film transistor 130, a storage capacitor 140, a first gate insulating layer 112, a first interlayer insulating layer 113, a second buffer layer 114, a second gate insulating layer 115, a second interlayer insulating layer 116, a first planarizing layer 117, a second planarizing layer 118, a first electrode 170, a connection electrode 150, a bank 180, an auxiliary electrode 160, a spacer 190, an emission structure 200, a second electrode 210, and an encapsulating unit 220.

The substrate 110 may support various components of the display apparatus 100. The substrate 110 may be formed of a glass, plastic, or other suitable material having flexibility. When the substrate 110 is formed of a plastic material, for example, polyimide (PI) may be used. When the substrate 110 is formed of polyimide (PI), the manufacturing process of the display apparatus may be performed under a circumstance when a support substrate formed of glass is disposed below the substrate 110, and the support substrate may be released after completing the manufacturing process of the display apparatus. Further, after releasing the support substrate, a back plate that supports the substrate 110 may be disposed below the substrate 110.

When the substrate 110 is formed of polyimide (PI), moisture components may pass through the substrate 110 formed of polyimide (PI) to permeate the first thin film transistor 120 or the emission structure 200 so that the performance of the display apparatus 100 may be deteriorated. The display apparatus 100 according to an example embodiment of the present disclosure may be configured by a double polyimide (PI) to suppress the deterioration of the performance of the display apparatus 100 due to the moisture permeation. Further, an inorganic layer may be formed between two polyimides (PI) to block the moisture components from passing through the upper polyimide (PI), so that the reliability may be further improved.

Further, when the inorganic layer is not formed between two polyimides (PI), charges charged in the lower polyimide (PI) may form a back bias to affect the first thin film transistor 120. Therefore, in order to block the charges charged in the polyimide (PI), a separate metal layer may need to be formed. However, according to the example embodiment of the present disclosure, an inorganic layer is formed between two polyimides (PI), so that charges charged in lower polyimide (PI) may be blocked, thereby improving the reliability of the product. Further, a process of forming a metal layer to block the charges charged in the polyimide PI may be omitted, so that the process may be simplified and the production cost may be reduced.

It may be very important for a flexible display apparatus using polyimide (PI) as a substrate 110 to ensure environmental reliability and performance reliability of the panel. The display apparatus 100 according to the example embodiment of the present disclosure may use double polyimide (PI) as a substrate to help ensure the environmental reliability. For example, as illustrated in FIG. 1, the substrate 110 of the display apparatus 100 may include a first polyimide layer 110a, a second polyimide layer 110c, and an inorganic insulating layer 110b formed between the first polyimide layer 110a and the second polyimide layer 110c. When the charges are charged in the first polyimide layer 110a, the inorganic insulating layer 110b may serve to block the charges from affecting the first thin film transistor 120 through the second polyimide layer 110c. Further, the inorganic insulating layer 110b formed between the first polyimide layer 110a and the second polyimide layer 110c may serve to block the moisture component from penetrating through the second polyimide layer 110c.

The inorganic insulating layer 110b may be formed by a single layer of silicon nitride (SiNx) or silicon oxide (SiOx) or a multi-layer thereof. In the display apparatus 100 according to the example embodiment of the present disclosure, the inorganic insulating layer 110b may be formed of a silicon oxide (SiOx) material. For example, the inorganic insulating layer 110b may be formed of a silica, silicon dioxide ($SiO_2$), or other material. However, the inorganic insulating layer 110b is not limited thereto, and may be formed by a double layer of silicon dioxide ($SiO_2$) and silicon nitride (SiNx).

The first buffer layer 111 may be formed on an entire surface of the substrate 110. The first buffer layer 111 may be formed by a single layer of silicon nitride (SiNx) or silicon oxide (SiOx) or a multi-layer thereof. The first buffer layer 111 may serve to improve adhesiveness between layers formed on the first buffer layer 111 and the substrate 110 and block alkali components leaked from the substrate 110. The first buffer layer 111 may be omitted based on a type or a material of the substrate 110 and a structure and a type of a thin film transistor.

According to the example embodiment of the present disclosure, the first buffer layer 111 may be formed as a multi-layer in which silicon dioxide ($SiO_2$) and silicon nitride (SiNx) are alternately formed. For example, the first buffer layer 111 may be formed of n+1 layers. Here, n denotes an even number including 0, such as 0, 2, 4, 6, and 8. Therefore, when n is 0, the first buffer layer 111 is formed as a single layer. Further, the first buffer layer 111 may be silicon nitride (SiNx) or silicon oxide (SiOx). When n is 2, the first buffer layer 111 may be formed as a triple layer. When the first buffer layer 111 is formed as a triple layer, an upper layer and a lower layer may be silicon oxide (SiOx), and an intermediate layer disposed between the upper layer and the lower layer may be silicon nitride (SiNx). When n is 4, the first buffer layer 111 may be formed as a five-layered structure. When the first buffer layer 111 is formed as a five-layered structure, as illustrated in FIG. 1, a 1-a-th buffer layer 111a may be formed on the substrate 110. Further, the 1-a-th buffer layer 111a may be formed of a silicon dioxide ($SiO_2$) material. Further, a 1-b-th buffer layer 111b may be formed of a silicon nitride (SiNx) material and disposed on the 1-a-th buffer layer 111a. Further, a 1-c-th buffer layer 111c may be formed of a silicon dioxide ($SiO_2$) material and disposed on the 1-b-th buffer layer 111b. Further, a 1-d-th buffer layer 111d may be formed of a silicon nitride (SiNx) material and disposed on the 1-c-th buffer layer 111c. Further, a 1-e-th buffer layer 111e may be formed of a silicon dioxide ($SiO_2$) material and disposed on the 1-d-th buffer layer 111d. As described above, when n is an even number which is equal to or larger than 2, the first buffer layer 111 may be formed as a multi-layer in which silicon oxide (SiOx) and silicon nitride (SiNx) are alternately formed. Further, an uppermost layer and a lowermost layer of the first buffer layer 111 formed as a multi-layer may be formed of a silicon oxide (SiOx) material. For example, the first buffer layer 111 formed of a plurality of layers may include an upper layer which is in contact with a first active layer 121 of the first thin film transistor 120, a lower layer which is in contact with the substrate 110, and an intermediate layer disposed between the upper layer and the lower layer. The upper layer and the lower layer may be formed of a silicon oxide (SiOx) material. Further, the upper layer of the first buffer layer 111 formed as a multi-layer may be formed to be thicker than the lower layer and the intermediate layer. A thickness of the upper layer of the first buffer layer 111 formed of a plurality of layers which is in contact with the first active layer 121 of the first thin film transistor 120 may be larger than thicknesses of the lower layer and the intermediate layer of the first buffer layer 111. For example, as illustrated in FIG. 1, when the first buffer layer 111 is a five-layered structure, the 1-e-th buffer layer 111e which is in contact with the first active layer 121 may be the upper layer. Further, the 1-a-th buffer layer 111a which is in contact with the substrate 110 may be the lower layer. Furthermore, the 1-b-th buffer layer 111b, the 1-c-th buffer layer 111c, and the 1-d-th buffer layer 111d which are disposed between the 1-a-th buffer layer 111a and the 1-e-th buffer layer 111e may be intermediate layers. Here, a thickness of the 1-e-th buffer layer 111e which is an upper layer may be larger than the thickness of the 1-a-th buffer layer 111a which is a lower layer and the thicknesses of the 1-b-th buffer layer 111b, the 1-c-th buffer layer 111c, and the 1-d-th buffer layer 111d which are intermediate layers. In an example, the thickness of the 1-e-th buffer layer 111e may be 3000 Å, and the thickness of the 1-a-th buffer layer 111a may be 1000 Å. Further, the thicknesses of the 1-b-th buffer layer 111b, the 1-c-th buffer layer 111c, and the 1-d-th buffer layer 111d may be 1000 Å.

In the first buffer layer 111 formed of a plurality of layers, a plurality of layers other than the upper layer which is in contact with the first active layer 121 of the first thin film transistor 120 may have the same thickness. For example, the thicknesses of the 1-a-th buffer layer 111a, the 1-b-th buffer layer 111b, the 1-c-th buffer layer 111c, and the 1-d-th buffer layer 111d (excluding the 1-e-th buffer layer 111e which is in contact with the first active layer 121) may be equal to each other.

The first thin film transistor 120 may be disposed on the first buffer layer 111. The first thin film transistor 120 may include the first active layer 121, a first gate electrode 124, a first source electrode 122, and a first drain electrode 123. Here, depending on the design of the pixel circuit, the first source electrode 122 may serve as a drain electrode, and the first drain electrode 123 may serve as a source electrode. The first active layer 121 of the first thin film transistor 120 may be disposed on the first buffer layer 111.

The first active layer 121 may include a low temperature poly silicon (LTPS). Such a polysilicon material may have a high mobility (100 cm$^2$/Vs or higher) so that energy power consumption is low and reliability is excellent. Therefore, the polysilicon material may be applied to a gate driver for driving elements which drive thin film transistors for a display element and/or a multiplexer (MUX), and also applied as an active layer of a driving thin film transistor of the display apparatus according to the example embodiment, but is not limited thereto. For example, the polysilicon material may be applied as an active layer of a switching thin film transistor depending on the characteristics of the display apparatus. An amorphous silicon (a-Si) material is deposited on the first buffer layer 111, a dehydrogenation process and a crystallization process are performed to form polysilicon, and the polysilicon is patterned to form the first active layer 121.

The first active layer 121 may include a first channel region 121a in which a channel is formed at the time of driving the first thin film transistor 120, and a first source region 121b and a first drain region 121c at both sides of the first channel region 121a. The first source region 121b refers to a part of the first active layer 121 which is connected to the first source electrode 122, and the first drain region 121c refers to a part of the first active layer 121 which is connected to the first drain electrode 123. The first source region 121b and the first drain region 121c may be configured by ion doping (impurity doping) of the first active layer 121. The first source region 121b and the first drain region 121c may be produced by doping ions into the polysilicon material, and the first channel region 121a may refer to a part that is not doped with ions and remains with the polysilicon material.

The first gate insulating layer 112 may be disposed on the first active layer 121 of the first thin film transistor 120. The first gate insulating layer 112 may be formed as a single layer of silicon nitride (SiNx) or silicon oxide (SiOx) or a multi-layer thereof. In the first gate insulating layer 112, a contact hole may be formed. And, the first source electrode 122 and the first drain electrode 123 of the first thin film transistor 120 are connected to the first source region 121b and the first drain region 121c of the first active layer 121 of the first thin film transistor 120 through the contact hole, respectively.

The first gate electrode 124 of the first thin film transistor 120 and a first capacitor electrode 141 of the storage capacitor 140 may be disposed on the first gate insulating layer 112.

The first gate electrode 124 and the first capacitor electrode 141 may be formed as a single layer or a multi-layer formed of any one of molybdenum (Mo), copper (Cu), titanium (Ti), aluminum (Al), chrome (Cr), gold (Au), nickel (Ni), and neodymium (Nd), or an alloy thereof. The first gate electrode 124 may be formed on the first gate insulating layer 112 to overlap the first channel region 121a of the first active layer 121 of the first thin film transistor 120. The first capacitor electrode 141 may be omitted based on a driving characteristic of the display apparatus 100 and a structure and a type of the thin film transistor. The first gate electrode 124 and the first capacitor electrode 141 may be formed by the same process. Further, the first gate electrode 124 and the first capacitor electrode 141 may be formed of the same material on the same layer.

The first interlayer insulating layer 113 may be disposed on the first gate insulating layer 112, the first gate electrode 124, and the first capacitor electrode 141. The first interlayer insulating layer 113 may be configured by a single layer of silicon nitride (SiNx) or silicon oxide (SiOx) or a multi-layer thereof. A contact hole through which the first source region 121b and the first drain region 121c of the first active layer 121 of the first thin film transistor 120 are exposed may be formed in the first interlayer insulating layer 113.

A second capacitor electrode 142 of the storage capacitor 140 may be disposed on the first interlayer insulating layer 113. The second capacitor electrode 142 may be formed as a single layer or a multi-layer formed of any one of molybdenum (Mo), copper (Cu), titanium (Ti), aluminum (Al), chrome (Cr), gold (Au), nickel (Ni), and neodymium (Nd), or an alloy thereof. The second capacitor electrode 142 may be formed on the first interlayer insulating layer 113 to overlap the first capacitor electrode 141. The second capacitor electrode 142 may be formed of the same material as the first capacitor electrode 141. The second capacitor electrode 142 may be omitted based on a driving characteristic of the display apparatus 100 and a structure and a type of the thin film transistor.

The second buffer layer 114 may be disposed on the first interlayer insulating layer 113 and the second capacitor electrode 142. The second buffer layer 114 may be configured as a single layer of silicon nitride (SiNx) or silicon oxide (SiOx) or a multi-layer thereof. A contact hole through which the first source region 121b and the first drain region 121c of the first active layer 121 of the first thin film transistor 120 are exposed may be formed in the second buffer layer 114. Further, the contact hole may be formed. And, the second capacitor electrode 142 of the storage capacitor 140 is exposed though the contact hole.

A second active layer 131 of the second thin film transistor 130 may be disposed on the second buffer layer 114. The second thin film transistor 130 may include the second active layer 131, a second gate insulating layer 115, a second gate electrode 134, a second source electrode 132, and a second drain electrode 133. Here, depending on the design of the pixel circuit, the second source electrode 132 may serve as a drain electrode, and the second drain electrode 133 may serve as a source electrode.

The second active layer 131 may include a second channel region 131a in which a channel is formed at the time of driving the second thin film transistor 130, and a second source region 131b and a second drain region 131c at both sides of the second channel region 131a. The second source region 131b refers to a part of the second active layer 131 which is connected to the second source electrode 132, and the second drain region 131c refers to a part of the second active layer 131 which is connected to the second drain electrode 133.

The second active layer 131 may be formed of an oxide semiconductor. The oxide semiconductor material may have a large band gap as compared with a silicon material, so that electrons cannot jump over the band gap in an off state. Therefore, the oxide semiconductor material may have a low off-current. Thus, the thin film transistor including an active layer, which is formed of an oxide semiconductor, may be suitable for a switching thin film transistor which maintains on-time to be short and off-time to be long, but is not limited thereto. Depending on the characteristic of the display apparatus, the oxide semiconductor may be applied as a driving thin film transistor. Further, due to the small off-current, a magnitude of an auxiliary capacitance may be reduced so that the oxide semiconductor may be appropriate for a high resolution display element.

For example, the second active layer 131 may be formed of metal oxide, such as various metal oxides including indium-gallium-zinc-oxide (IGZO). Under the assumption that the second active layer 131 of the second thin film transistor 130 is formed of IGZO, among various metal oxides, it has been described that the active layer is formed based on the IGZO layer, but it is not limited thereto. Therefore, the active layer may be formed of another metal oxide such as indium-zinc-oxide (IZO), indium-gallium-tin-oxide (IGTO), or indium-gallium-oxide (IGO), other than IGZO.

The second active layer 131 may be formed by depositing the metal oxide on the second buffer layer 114, performing a heat treatment for stabilization, and then patterning the metal oxide.

An insulating material layer and a metal material layer are formed in this order on the entire surface of the substrate including the second active layer 131, and a photoresist pattern is formed on the metal material layer. The insulating material layer may be formed using a PECVD method, and the metal material layer may be formed using a sputtering method.

The metal material layer is subjected to the wet etching with a photoresist pattern PR as a mask to form a second gate electrode 134. As a wet etchant for etching the metal material layer, a material which selectively etches molybdenum (Mo), copper (Cu), titanium (Ti), aluminum (Al), chrome (Cr), gold (Au), nickel (Ni), and neodymium (Nd), or an alloy thereof, (which configure the metal material layer), but does not etch the insulating material layer, may be used.

The insulating material layer is subjected to the dry etching with the photoresist pattern PR and the second gate electrode 134 as masks to form the second gate insulating layer 115.

The insulating material layer is etched by the dry etching process so that a pattern of the second gate insulating layer 115 may be formed on the second active layer 131. A part of the second active layer 131 exposed through the patterned second gate insulating layer 115 may become conductive when the second gate insulating layer 115 is patterned by the dry etching process.

The second active layer 131, which includes a second channel region 131a that does not become conductive, and a second source region 131b and the second drain region 131c that become conductive at both ends of the second active layer 131, may be formed corresponding to the region where the second gate electrode 134 is formed.

Resistance of the second source region 131b and the second drain region 131c of the second active layer 131 that become conductive is lowered so that the element performance of the second thin film transistor 130 may be improved. Accordingly, the reliability of the display apparatus 100 according to the example embodiment of the present disclosure may be improved.

The second channel region 131a of the second active layer 131 may be disposed to overlap the second gate electrode 134. The second source region 131b and the second drain region 131c of the second active layer 131 may be disposed at both sides of the second channel region 131a. Further, the second gate insulating layer 115 may be disposed between the second gate electrode 134 and the second active layer 131. Further, the second gate insulating layer 115 may be disposed so as to overlap the second gate electrode 134 and the second channel region 131a of the second active layer 131.

The second gate insulating layer 115 and the second gate electrode 134 may be formed to have the same pattern by etching the insulating material layer and the metal material layer using the photoresist pattern PR as a mask. The second gate insulating layer 115 may be disposed on the second active layer 131. The second gate insulating layer 115 may be configured by a single layer of silicon nitride (SiNx) or silicon oxide (SiOx), or a multi-layer thereof. The second gate insulating layer 115 may be patterned to overlap the second channel region 131a of the second active layer 131. The second gate electrode 134 may be disposed on the second gate insulating layer 115. The second gate electrode 134 may be formed of a single layer or a multi-layer formed of any one of molybdenum (Mo), copper (Cu), titanium (Ti), aluminum (Al), chrome (Cr), gold (Au), nickel (Ni), and neodymium (Nd), or an alloy thereof. The second gate electrode 134 may be patterned to overlap the second active layer 131 and the second gate insulating layer 115. Furthermore, the second gate electrode 134 may be patterned to overlap the second channel region 131a of the second active layer 131. And, the second gate insulating layer 115 may be patterned to overlap the second channel region 131a of the second active layer 131.

Therefore, the second gate electrode 134 and the second gate insulating layer 115 may overlap the second channel region 131a of the second active layer 131. The second interlayer insulating layer 116 may be disposed on the second buffer layer 114, the second active layer 131, and the second gate electrode 134. A contact hole through which the first active layer 121 of the first thin film transistor 120 and the second active layer 131 of the second thin film transistor 130 are exposed may be formed in the second interlayer insulating layer 116. For example, a contact hole through which the first source region 121b and the first drain region 121c of the first active layer 121 are exposed from the first thin film transistor 120 may be formed in the second interlayer insulating layer 116. Further, a contact hole through which the second source region 131b and the second drain region 131c of the second active layer 131 are exposed from the second thin film transistor 130 may be formed in the second interlayer insulating layer 116. The second interlayer insulating layer 116 may be configured by a single layer of silicon nitride (SiNx) or silicon oxide (SiOx), or a multi-layer thereof.

A connection electrode 150, the first source electrode 122 and the first drain electrode 123 of the first thin film transistor 120, and the second source electrode 132 and the second drain electrode 133 of the second thin film transistor 130 may be disposed on the second interlayer insulating layer 116.

The first source electrode 122 and the first drain electrode 123 of the first thin film transistor 120 may be connected to the first active layer 121 of the first thin film transistor 120 through the contact holes formed in the first gate insulating layer 112, the first interlayer insulating layer 113, the second buffer layer 114, and the second interlayer insulating layer 116. Therefore, the first source electrode 122 of the first thin film transistor 120 may be connected to the first source region 121b of the first active layer 121 through the contact holes formed in the first gate insulating layer 112, the first interlayer insulating layer 113, the second buffer layer 114, and the second interlayer insulating layer 116. Further, the first drain electrode 123 of the first thin film transistor 120 may be connected to the first drain region 121c of the first active layer 121 through the contact holes formed in the first gate insulating layer 112, the first interlayer insulating layer 113, the second buffer layer 114, and the second interlayer insulating layer 116.

The connection electrode 150 may be electrically connected to the second drain electrode 133 of the second thin film transistor 130. Further, the connection electrode 150 may be electrically connected to the second capacitor electrode 142 of the storage capacitor 140 through the contact holes formed in the second buffer layer 114 and the second interlayer insulating layer 116. Therefore, the connection electrode 150 may serve to electrically connect the second capacitor electrode 142 of the storage capacitor 140 and the second drain electrode 133 of the second thin film transistor 130 to each other.

The second source electrode 132 and the second drain electrode 133 of the second thin film transistor 130 may be connected to the second active layer 131 through the contact hole formed in the second interlayer insulating layer 116. Therefore, the second source electrode 132 of the second thin film transistor 130 may be connected to the second source region 131b of the second active layer 131 through the contact hole formed in the second interlayer insulating layer 116. The second drain electrode 133 of the second thin film transistor 130 may be connected to the second drain region 131c of the second active layer 131 through the contact hole formed in the second interlayer insulating layer 116.

The connection electrode 150, the first source electrode 122 and the first drain electrode 123 of the first thin film transistor 120, and the second source electrode 132 and the second drain electrode 133 of the second thin film transistor 130 may be formed by the same process. Further, the connection electrode 150, the first source electrode 122 and the first drain electrode 123 of the first thin film transistor 120, and the second source electrode 132 and the second drain electrode 133 of the second thin film transistor 130 may be formed of the same material. The connection electrode 150, the first source electrode 122 and the first drain electrode 123 of the first thin film transistor 120, and the second source electrode 132 and the second drain electrode 133 of the second thin film transistor 130 may be formed as a single layer or a multi-layer formed of any one of molybdenum (Mo), copper (Cu), titanium (Ti), aluminum (Al), chrome (Cr), gold (Au), nickel (Ni), and neodymium (Nd), or an alloy thereof. For example, the connection electrode 150, the first source electrode 122 and the first drain electrode 123 of the first thin film transistor 120, and the second source electrode 132 and the second drain electrode 133 of the second thin film transistor 130 may be formed by a three-layer structure of titanium (Ti)/aluminum (Al)/titanium (Ti) formed of conductive metal materials, but are not limited thereto.

The connection electrode 150 may be integrally formed to be connected to the second drain electrode 133 of the second thin film transistor 130.

The first planarizing layer 117 may be disposed on the connection electrode 150, the first source electrode 122, and the first drain electrode 123 of the first thin film transistor 120, the second source electrode 132 and the second drain electrode 133 of the second thin film transistor 130, and the second interlayer insulating layer 116. As illustrated in FIG. 1, a contact hole may be formed in the first planarizing layer 117 to expose the second drain electrode 133, but is not limited thereto. For example, a contact hole may be formed in the first planarizing layer 117 to expose the second source electrode 132 of the second thin film transistor 130. Alternatively, a contact hole may be formed in the first planarizing layer 117 to expose the connection electrode 150 which is electrically connected to the second drain electrode 133 of the second thin film transistor 130. The first planarizing layer 117 may be an organic material layer which planarizes and protects upper portions of the first thin film transistor 120 and the second thin film transistor 130. For example, the first planarizing layer 117 may be formed of an organic material such as acryl resin, epoxy resin, phenolic resin, polyamide resin, or polyimide resin.

The auxiliary electrode 160 may be disposed on the first planarizing layer 117. The auxiliary electrode 160 may be connected to the second drain electrode 133 of the second thin film transistor 130 through the contact hole of the first planarizing layer 117. The auxiliary electrode 160 may serve to electrically connect the second thin film transistor 130 and the first electrode 170 with each other. The auxiliary electrode 160 may be formed of a single layer or a multi-layer formed of any one of molybdenum (Mo), copper (Cu), titanium (Ti), aluminum (Al), chrome (Cr), gold (Au), nickel (Ni), and neodymium (Nd), or an alloy thereof. The auxiliary electrode 160 may be formed of the same material as the second source electrode 132 and the second drain electrode 133 of the second thin film transistor 130.

The second planarizing layer 118 may be disposed on the auxiliary electrode 160 and the first planarizing layer 117. Further, as illustrated in FIG. 1, a contact hole may be formed in the second planarizing layer 118 to expose the auxiliary electrode 160. The second planarizing layer 118 may be an organic material layer which planarizes upper portions of the first thin film transistor 120 and the second thin film transistor 130. For example, the second planarizing layer 118 may be formed of an organic material, such as acryl resin, epoxy resin, phenolic resin, polyamide resin, or polyimide resin.

The first electrode 170 may be disposed on the second planarizing layer 118. The first electrode 170 may be electrically connected to the auxiliary electrode 160 through the contact hole formed in the second planarizing layer 118. Therefore, the first electrode 170 is electrically connected to the auxiliary electrode 160 through the contact hole formed in the second planarizing layer 118 to be electrically connected to the second thin film transistor 130.

The first electrode 170 may be formed to have a multi-layered structure including a transparent conductive layer and an opaque conductive layer having high reflection efficiency. The transparent conductive layer may be formed of a material having a high work function, such as indium-tin-oxide (ITO) or indium-zinc-oxide (IZO). The opaque conductive layer may be formed to have a single layer or a multi-layered structure including Al, Ag, Cu, Pb, Mo, Ti, or an alloy thereof. For example, the first electrode 170 may be formed to have a structure in which a transparent conductive layer, an opaque conductive layer, and a transparent conductive layer are sequentially laminated. However, the first electrode 170 is not limited thereto but may also be formed to have a structure in which the transparent conductive layer and the opaque conductive layer are sequentially laminated.

Because the display apparatus 100 according to the example embodiment of the present disclosure is a top emission display apparatus, the first electrode 170 may be an anode electrode. When the display apparatus 100 is a bottom emission type, the first electrode 170 disposed on the second planarizing layer 118 may be a cathode electrode.

A bank 180 may be disposed on the first electrode 170 and the second planarizing layer 118. An opening may be formed in the bank 180 to expose the first electrode 170. Because the bank 180 defines an emission area of the display apparatus 100, the bank 180 may also be referred to as a pixel definition layer. A spacer 190 may be further disposed on the bank 180. Further, an emission structure 200 including a light emitting layer may be further disposed on the first electrode 170.

The emission structure 200 may be formed such that a hole layer, a light emitting layer, and an electron layer are laminated on the first electrode 170 in this order or a reverse order. Further, the emission structure 200 may include first and second emission structures which are opposite to each other with a charge generating layer therebetween. In this case, any one light emitting layer of the first and second emission structures generates blue light and the other one of the first and second emission structures generates yellow-green light so that white light may be generated by the first and the second emission structures. The white light generated in the emission structure 200 is incident onto a color filter (not illustrated) disposed above the emission structure 200 to implement color images. In addition, individual emission structures 200 generate color light corresponding to individual sub pixels without having separate color filters to implement color images. That is, the emission structure 200 of a red R sub pixel generates red light, the emission structure 200 of a green G sub pixel generates green light, and the emission structure 200 of a blue B sub pixel generates blue light.

The second electrode 210 may be further disposed on the emission structure 200. The second electrode 210 may be disposed on the emission structure 200 to be opposite to the first electrode 170 with the emission structure 200 therebetween. In the display apparatus 100 according to the example embodiment of the present disclosure, the second electrode 210 may be a cathode electrode. The encapsulating unit 220 may be further disposed on the second electrode 210 to suppress moisture permeation.

The encapsulating unit 220 may include a first inorganic encapsulating layer 220a, a second organic encapsulating layer 220b, and a third inorganic encapsulating layer 220c. The first inorganic encapsulating layer 220a of the encapsulating unit 220 may be disposed on the second electrode 210. The second organic encapsulating layer 220b may be disposed on the first inorganic encapsulating layer 220a. Further, the third inorganic encapsulating layer 220c may be disposed on the second organic encapsulating layer 220b. The first inorganic encapsulating layer 220a and the third inorganic encapsulating layer 220c of the encapsulating unit 220 may be formed of an inorganic material, such as silicon nitride (SiNx) or silicon oxide (SiOx). The second organic encapsulating layer 220b of the encapsulating unit 220 may be formed of an organic material such as acryl resin, epoxy resin, phenolic resin, polyamide resin, or polyimide resin.

Figure 2:
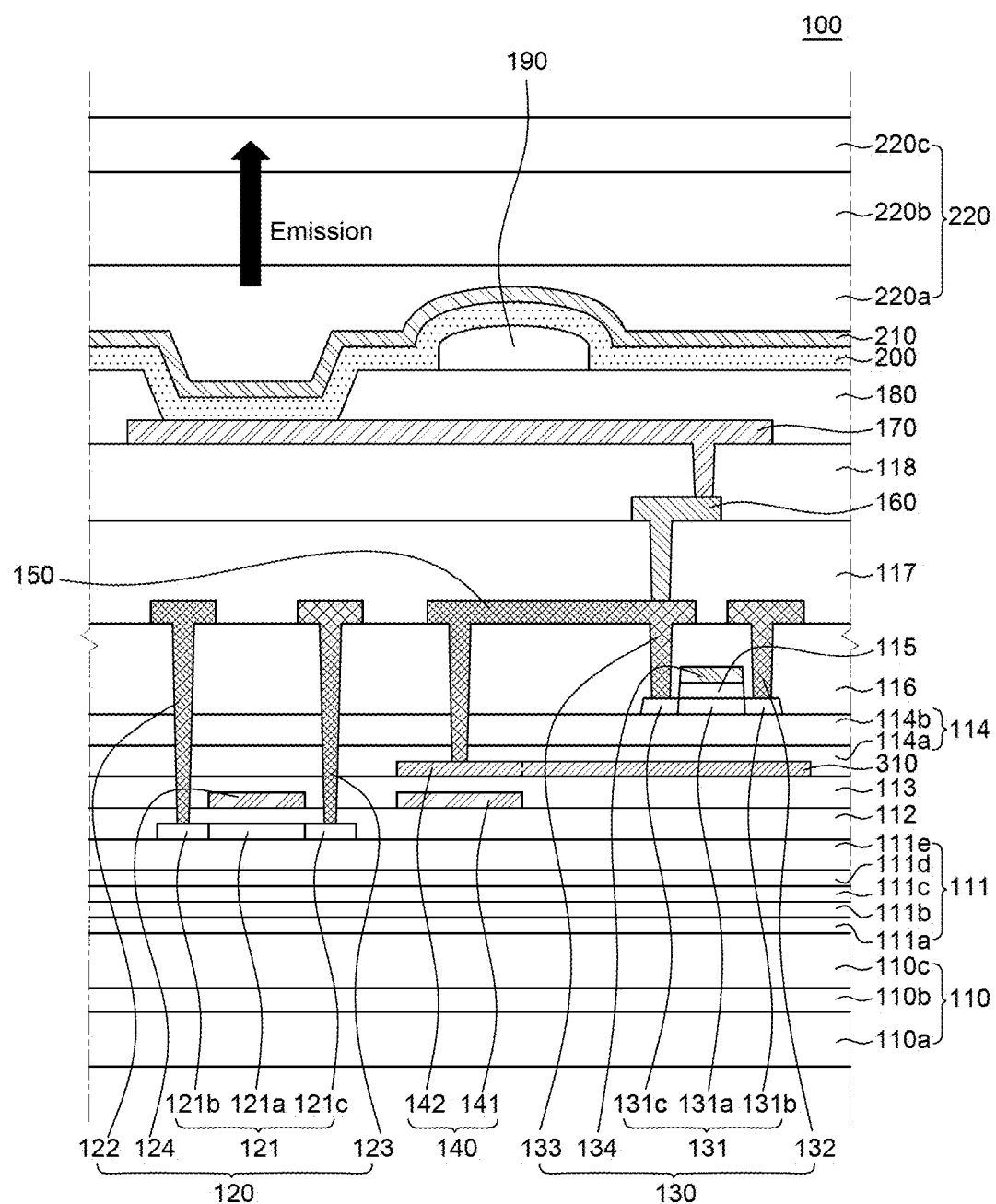
FIG. 2 is a cross-sectional view of a display apparatus according to another example embodiment of the present disclosure.

FIG. 2 is a cross-sectional view of a display apparatus 100 according to another example embodiment of the present disclosure. The display apparatus according to another example embodiment of the present disclosure will be described with reference to FIG. 1 and repeated description will be omitted or briefly described. For example, the substrate 110, the first buffer layer 111, the first gate insulating layer 112, the first interlayer insulating layer 113, the second gate insulating layer 115, the second interlayer insulating layer 116, the first planarizing layer 117, the second planarizing layer 118, the connection electrode 150, the auxiliary electrode 160, the first electrode 170, the bank 180, the spacer 190, the emission structure 200, the second electrode 210, the encapsulating unit 220, the first thin film transistor 120, and the second thin film transistor 130 may be substantially the same. Therefore, repeated description for the configuration of FIG. 2 which is substantially the same as the configuration of FIG. 1 may be omitted or briefly described.

With reference to FIG. 2, a display apparatus 100 according to another example embodiment of the present disclosure includes a substrate 110, a first buffer layer 111, a first thin film transistor 120, a second thin film transistor 130, a first gate insulating layer 112, a first interlayer insulating layer 113, a second buffer layer 114, a second gate insulating layer 115, a second interlayer insulating layer 116, a first planarizing layer 117, a second planarizing layer 118, a storage capacitor 140, a blocking layer 310, a connection electrode 150, a bank 180, an auxiliary electrode 160, a first electrode 170, a spacer 190, an emission structure 200, a second electrode 210, and an encapsulating unit 220. The first active layer 121 of the first thin film transistor 120 may be formed of LTPS and the second active layer 131 of the second thin film transistor 130 may be formed of an oxide semiconductor.

A first polyimide layer 110a and a second polyimide layer 110c of the substrate 110 of the display apparatus 100 contain impurities and a large amount of hydrogen, which affects the characteristics of the oxide semiconductor of the second active layer 131. For example, the large amount of hydrogen remaining in the first polyimide layer 110a and the second polyimide layer 110c diffuses into the second active layer 131 of the second thin film transistor 130, which due to the oxide semiconductor may cause bright dot defects. Polyimide (PI) used for the substrate 110 contains a large amount of hydrogen. Particularly, when the hydrogen generated in the substrate 110 flows into the second channel region 131a of the second active layer 131 which is configured by the oxide semiconductor, the second channel region 131a of the second active layer 131 may become conductive. When the second channel region 131a of the second active layer 131 becomes conductive, the second thin film transistor 130 is turned on at all the times and loses a function as a thin film transistor. The bright dot defects may be caused by the second thin film transistor 130 which loses the function as a thin film transistor and is turned on.

The display apparatus 100 according to the example embodiment of the present disclosure may further include the blocking layer 310 in an area which overlaps the second active layer 131 of the second thin film transistor 130 to suppress the diffusion of hydrogen, which may deteriorate the characteristics of the second thin film transistor 130. The blocking layer 310 may be formed during the process of forming the second capacitor electrode 142 of the storage capacitor 140. Because the blocking layer 310 is formed by the same process as the second capacitor electrode 142 of the storage capacitor 140, the blocking layer 310 may be integrally formed to be connected to the second capacitor electrode 142. For example, as illustrated in FIG. 2, the blocking layer 310 may be formed by extending the second capacitor electrode 142 of the storage capacitor 140 to overlap the second active layer 131 of the second thin film transistor 130. However, the blocking layer 310 is not limited thereto and may be formed to overlap the second active layer 131 of the second thin film transistor 130 and be separated from the second capacitor electrode 142 of the storage capacitor 140. In this case, the blocking layer 310 may be formed on the same layer on which the second capacitor electrode 142 of the storage capacitor 140 is formed. For example, the blocking layer 310 may be formed on the first interlayer insulating layer 113.

The blocking layer 310 which is integrally formed by extending the second capacitor electrode 142 of the storage capacitor 140 may be disposed to overlap the second channel region 131a of the second active layer 131. The blocking layer 310 may be formed on the first interlayer insulating layer 113. The blocking layer 310 may be disposed below the second active layer 131 and in an area overlapping the second active layer 131. The blocking layer 310 may be disposed below the second active layer 131 and overlaps the second active layer 131 so that the hydrogen generated in the substrate 110 may be suppressed from diffusing to the second active layer 131 of the second thin film transistor 130.

Charges may be charged in the blocking layer 310 which is connected to the second capacitor electrode 142 to be integrally formed. In order to block the charges charged in the blocking layer 310 from being transmitted to the second active layer 131 of the second thin film transistor 130, the second buffer layer 114 may be formed as a multi-layer. When the second buffer layer 114 is formed as a multi-layer, an uppermost layer of the second buffer layer 114 which is in contact with the second active layer 131 may be formed of a silicon oxide (SiOx) material having a low hydrogen content. For example, the uppermost layer of the second buffer layer 114 may be formed of a silicon dioxide (SiO₂) material. Further, at least one silicon nitride (SiNx) material layer having a high insulation property may be disposed between the uppermost layer formed of a silicon oxide (SiOx) material and the blocking layer 310. For example, as illustrated in FIG. 2, when the second buffer layer 114 is formed as a double layer, the second buffer layer 114 may include a second lower buffer layer 114a disposed on the blocking layer 310 and a second upper buffer layer 114b disposed on the second lower buffer layer 114a. The second upper buffer layer 114b which is in direct contact with a lower surface of the second active layer 131 may have a hydrogen content lower than that of the second lower buffer layer 114a. The second lower buffer layer 114a disposed between the blocking layer 310 and the second upper buffer layer 114b may have a higher insulation property than that of the second upper buffer layer 114b. The second upper buffer layer 114b of the second buffer layer 114 which is in direct contact with the second active layer 131 of the second thin film transistor 130 may be formed of silicon oxide (SiOx). For example, the second upper buffer layer 114b may be formed of silicon dioxide (SiO₂). Further, the second lower buffer layer 114a disposed between the second upper buffer layer 114b and the blocking layer 310 may be formed of silicon nitride (SiNx).

The second lower buffer layer 114a which is formed of silicon nitride (SiNx) having a relatively higher insulating property than that of silicon oxide (SiOx) is disposed on the blocking layer 310 so that the charges charged in the blocking layer 310 may be suppressed from being transmitted to the second active layer 131 of the second thin film transistor 130. Further, the second upper buffer layer 114b which is formed of silicon oxide (SiOx) having a relatively lower hydrogen content than that of the silicon nitride (SiNx) may suppress the diffusion of the hydrogen into the second active layer 131 of the second thin film transistor 130.

Therefore, in the display apparatus 100 according to the example embodiment of the present disclosure, the blocking layer 310, which is integrally formed to be connected to the second capacitor electrode 142 to overlap the second active layer 131 of the second thin film transistor 130, is disposed to suppress the diffusion of the hydrogen generated in the substrate 110 to the second active layer 131. Further, the second buffer layer 114 disposed between the blocking layer 310 and the second active layer 131 may be formed as a multi-layer configured by a second upper buffer layer 114b having a relatively low hydrogen content and a second lower buffer layer 114a having a relatively high insulation property. The second upper buffer layer 114b is disposed to be in contact with the lower surface of the second active layer 131 to suppress the diffusion of the hydrogen to the second active layer 131 of the second thin film transistor 130. Further, the second lower buffer layer 114a is disposed between the blocking layer 310 and the second upper buffer layer 114b so that the charges charged in the blocking layer 310 may be suppressed from being transmitted to the second active layer 131 of the second thin film transistor 130. Therefore, the reliability of the display apparatus 100 according to the example embodiment of the present disclosure may be improved.

Figure 3:
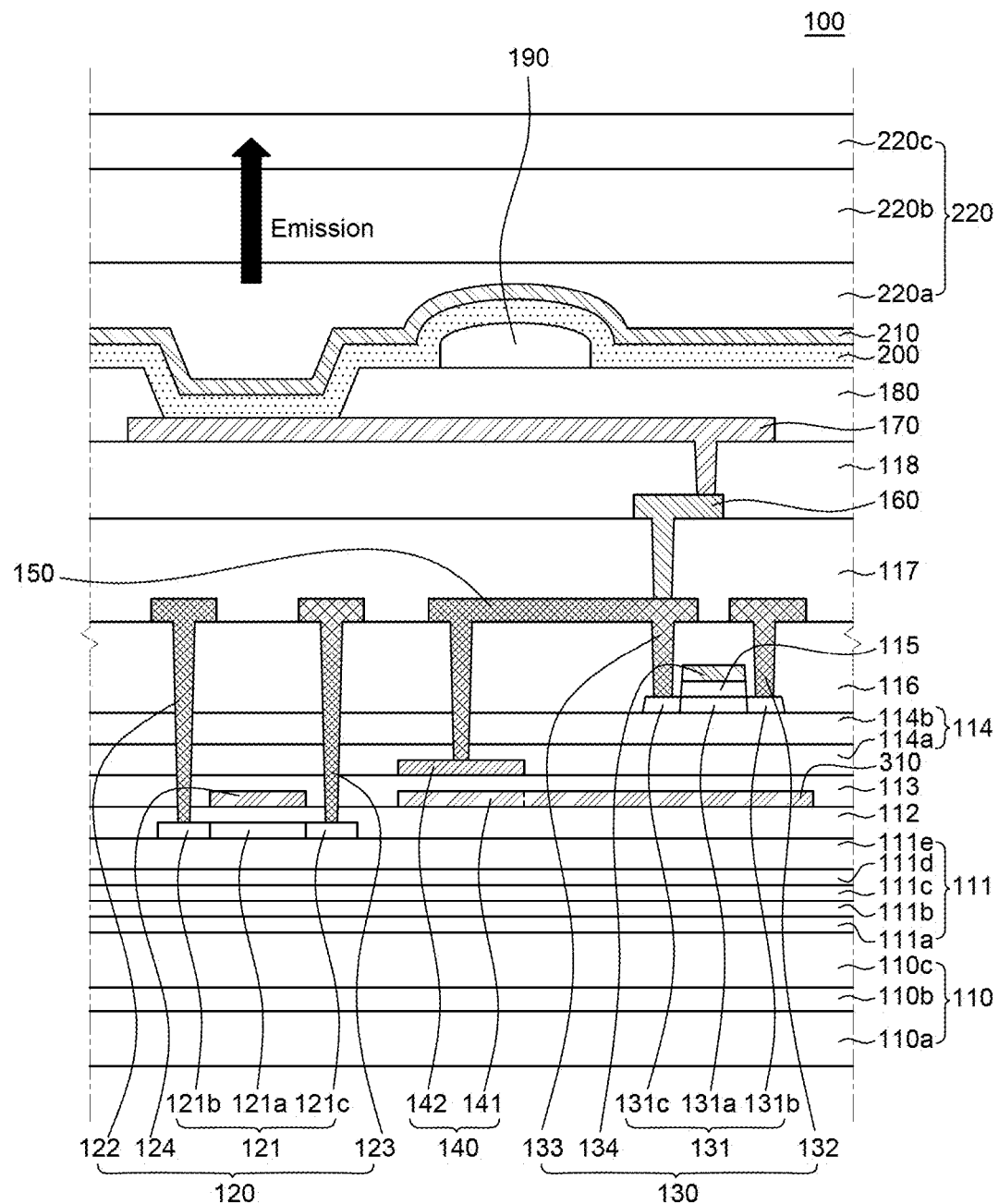
FIG. 3 is a cross-sectional view of a display apparatus according to another example embodiment of the present disclosure.

FIG. 3 is a cross-sectional view of a display apparatus 100 according to another example embodiment of the present disclosure. The display apparatus according to another example embodiment of the present disclosure will be described with reference to FIG. 2 and repeated description will be omitted or briefly described. For example, the substrate 110, the first buffer layer 111, the first gate insulating layer 112, the first interlayer insulating layer 113, the second buffer layer 114, the second gate insulating layer 115, the second interlayer insulating layer 116, the first planarizing layer 117, the second planarizing layer 118, the connection electrode 150, the auxiliary electrode 160, the first electrode 170, the bank 180, the spacer 190, the emission structure 200, the second electrode 210, the encapsulating unit 220, the first thin film transistor 120, and the second thin film transistor 130 may be substantially the same. Therefore, repeated description for the configuration of FIG. 3 which is substantially the same as the configuration of FIG. 2 may be omitted or briefly described.

With reference to FIG. 3, a display apparatus 100 according to another example embodiment of the present disclosure includes a substrate 110, a first buffer layer 111, a first thin film transistor 120, a second thin film transistor 130, a first gate insulating layer 112, a first interlayer insulating layer 113, a second buffer layer 114, a second gate insulating layer 115, a second interlayer insulating layer 116, a first planarizing layer 117, a second planarizing layer 118, a storage capacitor 140, a blocking layer 310, a connection electrode 150, a bank 180, an auxiliary electrode 160, a first electrode 170, a spacer 190, an emission structure 200, a second electrode 210, and an encapsulating unit 220. The first active layer 121 of the first thin film transistor 120 may be formed of LTPS and the second active layer 131 of the second thin film transistor 130 may be formed of an oxide semiconductor.

The display apparatus 100 according to the example embodiment of the present disclosure may further include a blocking layer 310 in an area which overlaps the second active layer 131 of the second thin film transistor 130 to suppress the diffusion of hydrogen which may deteriorate the characteristics of the second thin film transistor 130. The blocking layer 310 may be formed during the process of forming the first capacitor electrode 141 of the storage capacitor 140. Because the blocking layer 310 is formed by the same process as the first capacitor 141 of the storage capacitor 140, the blocking layer 310 may be integrally formed to be connected to the first capacitor electrode 141. For example, as illustrated in FIG. 3, the blocking layer 310 may be formed by extending the first capacitor electrode 141 of the storage capacitor 140 to overlap the second active layer 131 of the second thin film transistor 130. However, the blocking layer 310 is not limited thereto and may be formed to overlap the second active layer 131 of the second thin film transistor 130 and be separated from the first capacitor electrode 141 of the storage capacitor 140. In this case, the blocking layer 310 may be formed on the same layer on which the first capacitor electrode 141 of the storage capacitor 140 is formed. For example, the blocking layer 310 may be formed on the first gate insulating layer 112.

The blocking layer 310, which is integrally formed by extending the first capacitor electrode 141 of the storage capacitor 140, may be disposed to overlap the second channel region 131a of the second active layer 131. The blocking layer 310 may be formed on the first gate insulating layer 112. The blocking layer 310 may be disposed below the second active layer 131 and in an area overlapping the second active layer 131. The blocking layer 310 is disposed below the second active layer 131 and overlaps the second active layer 131 so that the hydrogen generated in the substrate 110 may be suppressed from diffusing to the second active layer 131 of the second thin film transistor 130.

The blocking layer 310 and the first capacitor electrode 141 may be formed by the same process as the second gate electrode 124 of the first thin film transistor 120. The blocking layer 310 and the first capacitor electrode 141 may be formed of the same material as the second gate electrode 124. The blocking layer 310 may be disposed between the substrate 110 and the second active layer 131 to overlap the second active layer 131.

Therefore, in the display apparatus 100 according to the example embodiment of the present disclosure, the blocking layer 310 which is integrally formed to be connected to the first capacitor electrode 141 to overlap the second active layer 131 of the second thin film transistor 130 is disposed to suppress the diffusion of the hydrogen generated in the substrate 110 to the second active layer 131. Therefore, the reliability of the display apparatus 100 according to the example embodiment of the present disclosure may be improved.

Figure 4:
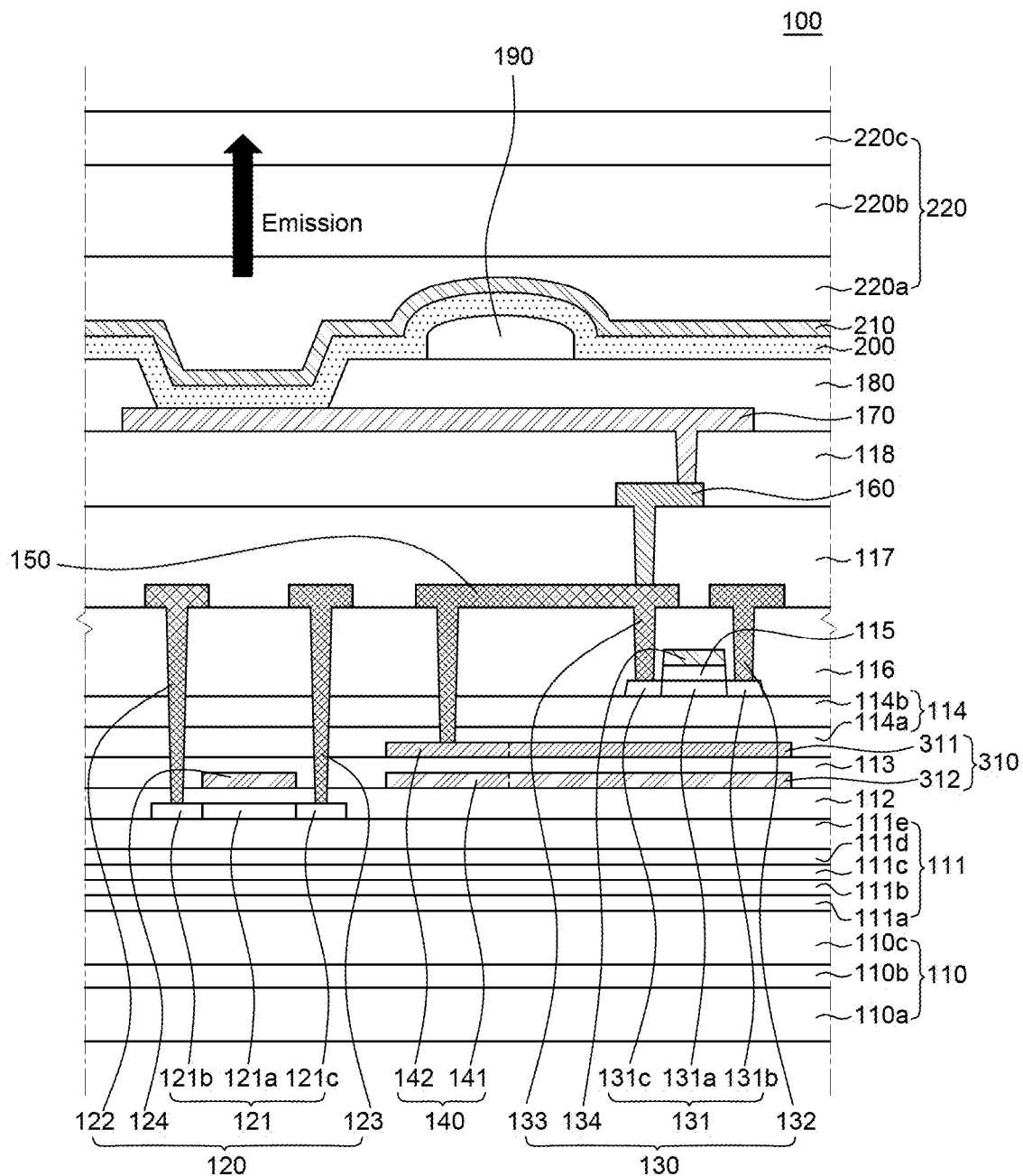
FIG. 4 is a cross-sectional view of a display apparatus according to another example embodiment of the present disclosure.

FIG. 4 is a cross-sectional view of a display apparatus 100 according to another example embodiment of the present disclosure.

The display apparatus according to another example embodiment of the present disclosure will be described with reference to FIG. 4 and repeated description will be omitted or briefly described. For example, the substrate 110, the first buffer layer 111, the first gate insulating layer 112, the first interlayer insulating layer 113, the second buffer layer 114, the second gate insulating layer 115, the second interlayer insulating layer 116, the first planarizing layer 117, the second planarizing layer 118, the connection electrode 150, the auxiliary electrode 160, the first electrode 170, the bank 180, the spacer 190, the emission structure 200, the second electrode 210, the encapsulating unit 220, the first thin film transistor 120, and the second thin film transistor 130 may be substantially the same. Therefore, repeated description for the configuration of FIG. 4 that is substantially the same as the configuration of FIG. 2 may be omitted or briefly described.

With reference to FIG. 4, a display apparatus 100 according to another example embodiment of the present disclosure includes a substrate 110, a first buffer layer 111, a first thin film transistor 120, a second thin film transistor 130, a first gate insulating layer 112, a first interlayer insulating layer 113, a second buffer layer 114, a second gate insulating layer 115, a second interlayer insulating layer 116, a first planarizing layer 117, a second planarizing layer 118, a storage capacitor 140, a blocking layer 310, a connection electrode 150, a bank 180, an auxiliary electrode 160, a first electrode 170, a spacer 190, an emission structure 200, a second electrode 210, and an encapsulating unit 220. The first active layer 121 of the first thin film transistor 120 may be formed of LTPS and the second active layer 131 of the second thin film transistor 130 may be formed of an oxide semiconductor.

The display apparatus 100 according to the example embodiment of the present disclosure may further include the blocking layer 310 in an area which overlaps the second active layer 131 of the second thin film transistor 130 to suppress the diffusion of hydrogen, which may deteriorate the characteristics of the second thin film transistor 130. The blocking layer 310 may include a first blocking layer 311 and a second blocking layer 312 disposed below the first blocking layer 311. The first blocking layer 311 may be formed during the process of forming the second capacitor electrode 142 of the storage capacitor 140. The second blocking layer 312 may be formed during the process of forming the first capacitor electrode 141 of the storage capacitor 140. Because the first blocking layer 311 is formed by the same process as the second capacitor electrode 142 of the storage capacitor 140, the first blocking layer 311 may be integrally formed to be connected to the second capacitor electrode 142. Because the second blocking layer 312 is formed by the same process as the first capacitor electrode 141 of the storage capacitor 140, the second blocking layer 312 may be integrally formed to be connected to the first capacitor electrode 141. For example, as illustrated in FIG. 4, the first blocking layer 311 may be formed by extending the second capacitor electrode 142 of the storage capacitor 140 to overlap the second active layer 131 of the second thin film transistor 130. Further, the second blocking layer 312 may be formed by extending the first capacitor electrode 141 of the storage capacitor 140 to overlap the second active layer 131 of the second thin film transistor 130. The first blocking layer 311 and the second blocking layer 312 may be disposed to overlap each other to form a capacitor. However, the first blocking layer 311 and the second blocking layer 312 are not limited thereto, and may be formed to overlap the second active layer 131 of the second thin film transistor 130 and be electrically separated from the second capacitor electrode 142 and the first capacitor electrode 141 of the storage capacitor 140.

The second blocking layer 312, which is integrally formed by extending the first capacitor electrode 141 of the storage capacitor 140, and the first blocking layer 311, which is integrally formed by extending the second capacitor electrode 142 of the storage capacitor 140, may be disposed to overlap the second channel region 131a of the second active layer 131. The first blocking layer 311 may be disposed on the first interlayer insulating layer 113 and the second blocking layer 312 may be disposed on the first gate insulating layer 112. The first blocking layer 311 and the second blocking layer 312 may be disposed below the second active layer 131 and in an area overlapping the second active layer 131. The first blocking layer 311 may be disposed between the second active layer 131 and the second blocking layer 312, and the second blocking layer 312 may be disposed between the first blocking layer 311 and the substrate 110. Further, the first blocking layer 311 and the second blocking layer 312 may be disposed to overlap each other. Further, the first blocking layer 311 and the second blocking layer 312 may be disposed to overlap the second active layer 131. The first blocking layer 311 and the second blocking layer 312 are disposed below the second active layer 131 and overlap the second active layer 131 so that the hydrogen generated in the substrate 110 may be suppressed from diffusing to the second active layer 131 of the second thin film transistor 130.

The second blocking layer 312 and the first capacitor electrode 141 may be formed by the same process as the first gate electrode 124 of the first thin film transistor 120. The second blocking layer 312 and the first capacitor electrode 141 may be formed of the same material as the first gate electrode 124.

Charges may be charged in the first blocking layer 311, which is connected to the second capacitor electrode 142 to be integrally formed. In order to block the charges charged in the first blocking layer 311 from being transmitted to the second active layer 131 of the second thin film transistor 130, the second buffer layer 114 may be formed as a multi-layer. When the second buffer layer 114 is formed as a multi-layer, an uppermost layer of the second buffer layer 114 which is in contact with the second active layer 131 may be formed of a silicon oxide (SiOx) material having a low hydrogen content. For example, the uppermost layer of the second buffer layer 114 may be formed of a silicon dioxide (SiO$_2$) material. Further, at least one silicon nitride (SiNx) material layer having a high insulation property may be disposed between the uppermost layer formed of a silicon oxide (SiOx) material and the first blocking layer 311. For example, as illustrated in FIG. 4, when the second buffer layer 114 is formed as a double layer, the second buffer layer 114 may include a second lower buffer layer 114a disposed on the first blocking layer 311 and a second upper buffer layer 114b disposed on the second lower buffer layer 114a. The second upper buffer layer 114b, which is in direct contact with a lower surface of the second active layer 131, may have a hydrogen content lower than that of the second lower buffer layer 114a. The second lower buffer layer 114a disposed between the first blocking layer 311 and the second upper buffer layer 114b may have a higher insulation property than that of the second upper buffer layer 114b. The second upper buffer layer 114b of the second buffer layer 114, which is in direct contact with the second active layer 131 of the second thin film transistor 130, may be formed of silicon oxide (SiOx). For example, the second upper buffer layer 114b may be formed of silicon dioxide (SiO$_2$). Further, the second lower buffer layer 114a disposed between the second upper buffer layer 114b and the first blocking layer 311 may be formed of silicon nitride (SiNx).

The second lower buffer layer 114a, which is formed of silicon nitride (SiNx) having a relatively higher insulating property than that of silicon oxide (SiOx), is disposed on the first blocking layer 311 so that the charges charged in the first blocking layer 311 may be suppressed from being transmitted to the second active layer 131 of the second thin film transistor 130. Further, the second upper buffer layer 114b, which is formed of silicon oxide (SiOx) having a relatively lower hydrogen content than that of the silicon nitride (SiNx), may suppress the diffusion of the hydrogen into the second active layer 131 of the second thin film transistor 130.

Therefore, in the display apparatus 100 according to the example embodiment of the present disclosure, the first blocking layer 311 and the second blocking layer 312, which are integrally formed to be connected to the second capacitor electrode 142 and the first capacitor electrode 141 to overlap the second active layer 131 of the second thin film transistor 130, are disposed to suppress the diffusion of the hydrogen generated in the substrate 110 to the second active layer 131. Further, the second buffer layer 114 disposed between the first blocking layer 311 and the second active layer 131 may be formed as a multi-layer configured by the second upper buffer layer 114b having a relatively low hydrogen content and the second lower buffer layer 114a having a relatively high insulation property. The second upper buffer layer 114b is disposed to be in contact with the lower surface of the second active layer 131 to suppress the diffusion of the hydrogen to the second active layer 131 of the second thin film transistor 130. Further, the second lower buffer layer 114a is disposed between the first blocking layer 311 and the second upper buffer layer 114b so that the charges charged in the first blocking layer 311 may be suppressed from being transmitted to the second active layer 131 of the second thin film transistor 130. Therefore, the reliability of the display apparatus 100 according to the example embodiment of the present disclosure may be improved.

Figure 5:
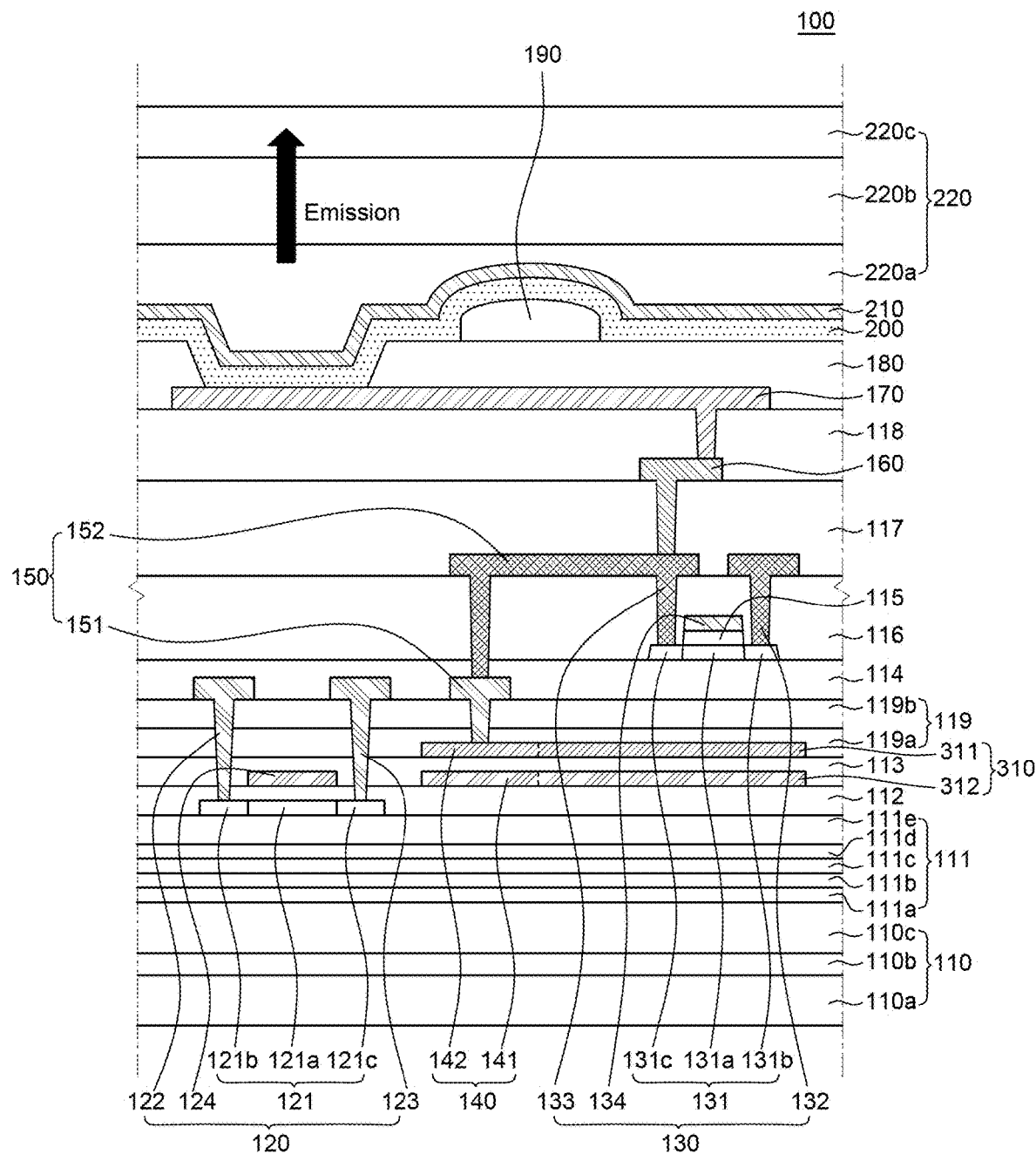
FIG. 5 is a cross-sectional view of a display apparatus according to another example embodiment of the present disclosure.

FIG. 5 is a cross-sectional view of a display apparatus 100 according to another example embodiment of the present disclosure.

The display apparatus according to another example embodiment of the present disclosure will be described with reference to FIG. 5 and repeated description will be omitted or briefly described. For example, the substrate 110, the first buffer layer 111, the first gate insulating layer 112, the first interlayer insulating layer 113, the second buffer layer 114, the second gate insulating layer 115, the second interlayer insulating layer 116, the first planarizing layer 117, the second planarizing layer 118, the auxiliary electrode 160, the first electrode 170, the bank 180, the spacer 190, the emission structure 200, the second electrode 210, the encapsulating unit 220, the blocking layer 310, the storage capacitor 140, and the second thin film transistor 130 may be substantially the same. Therefore, repeated description for the configuration of FIG. 5 which is substantially the same as the configuration of FIG. 2 may be omitted or briefly described.

With reference to FIG. 5, a display apparatus 100 according to another example embodiment of the present disclosure includes a substrate 110, a first buffer layer 111, a first thin film transistor 120, a second thin film transistor 130, a first gate insulating layer 112, a first interlayer insulating layer 113, a second buffer layer 114, a second gate insulating layer 115, a second interlayer insulating layer 116, a first planarizing layer 117, a second planarizing layer 118, a storage capacitor 140, a blocking layer 310, a connection electrode 150, a bank 180, an auxiliary electrode 160, a first electrode 170, a spacer 190, an emission structure 200, a second electrode 210, and an encapsulating unit 220. The first active layer 121 of the first thin film transistor 120 may be formed of LTPS and the second active layer 131 of the second thin film transistor 130 may be formed of an oxide semiconductor.

In the display apparatus 100 according to another example embodiment of the present disclosure, the connection electrode 150 may include a first connection electrode 151 and a second connection electrode 152 disposed on the first connection electrode 151. Further, the display apparatus 100 may further include an auxiliary interlayer insulating layer 119 disposed between the second buffer layer 114 and the second capacitor electrode 142.

Further, a first source electrode 122 and a first drain electrode 123 of the first thin film transistor 120 may be disposed below the second buffer layer 114. For example, as illustrated in FIG. 5, the auxiliary interlayer insulating layer 119 may be disposed on the second capacitor electrode 142 of the storage capacitor 140 and the first blocking layer 311 of the blocking layer 310. In the auxiliary interlayer insulating layer 119, a contact hole may be formed. And, the first source electrode 122 and the first drain electrode 123 of the first thin film transistor 120 are connected to the first source region 121b and the first drain region 121c of the first active layer 121 of the first thin film transistor 120 through the contact hole, respectively. Further, in the auxiliary interlayer insulating layer 119, a contact hole may be formed. And, the first connection electrode 151 of the connection electrode 150 is connected to the second capacitor electrode 142 through the contact hole.

The auxiliary interlayer insulating layer 119 may be formed as a double layer including a first auxiliary interlayer insulating layer 119a and a second interlayer insulating layer 119b. When the auxiliary interlayer insulating layer 119 is formed as a double layer including the first auxiliary interlayer insulating layer 119a and the second auxiliary interlayer insulating layer 119b on the first auxiliary interlayer insulating layer 119a, the first auxiliary interlayer insulating layer 119a may be silicon oxide (SiOx). Further, the second auxiliary interlayer insulating layer 119b may be silicon nitride (SiNx). In the first auxiliary interlayer insulating layer 119a and the second auxiliary interlayer insulating layer 119b, contact holes may be formed. And, the first source electrode 122 and the first drain electrode 123 are connected to the first source region 121b and the first drain region 121c of the first active layer 121 of the first thin film transistor 120 through the contact holes, respectively. Further, in the first auxiliary interlayer insulating layer 119a and the second auxiliary interlayer insulating layer 119b, a contact hole may be formed. And, the first connection electrode 151 of the connection electrode 150 is connected to the second capacitor electrode 142 through the contact hole. Further, the first connection electrode 151, and the first source electrode 122 and the first drain electrode 123 of the first thin film transistor 120 may be disposed on the auxiliary interlayer insulating layer 119. The first source electrode 122 and the first drain electrode 123 of the first thin film transistor 120 may be connected to the first active layer 121 of the first thin film transistor 120 through the contact holes formed in the first gate insulating layer 112, the first interlayer insulating layer 113, and the auxiliary interlayer insulating layer 119. The first connection electrode 151 may be connected to the storage capacitor 140 through the contact hole formed in the auxiliary interlayer insulating layer 119. The first source electrode 122 of the first thin film transistor 120 may be connected to the first source region 121b of the first active layer 121 through the contact holes formed in the first gate insulating layer 112, the first interlayer insulating layer 113, and the auxiliary interlayer insulating layer 119. And, the first drain electrode 123 of the first thin film transistor 120 may be connected to the first drain region 121c of the first active layer 121 through the contact holes formed in the first gate insulating layer 112, the first interlayer insulating layer 113, and the auxiliary interlayer insulating layer 119. The first connection electrode 151 may be connected to the second capacitor electrode 142 of the storage capacitor 140 through the contact hole formed in the auxiliary interlayer insulating layer 119.

Further, the second buffer layer 114 may be disposed on the first connection electrode 151, the first source electrode 122, and the first drain electrode 123 of the first thin film transistor 120. The second thin film transistor 130 may be formed on the second buffer layer 114.

The second connection electrode 152 may be electrically connected to the second drain electrode 133 of the second thin film transistor 130. Further, the second connection electrode 152 may be electrically connected to the first connection electrode 151 through the contact holes formed in the second buffer layer 114 and the second interlayer insulating layer 116. Therefore, the first connection electrode 151 and the second connection electrode 152 of the connection electrode 150 may serve to electrically connect the second capacitor electrode 142 of the storage capacitor 140 and the second drain electrode 133 of the second thin film transistor 130 to each other.

With reference to FIG. 5, the first thin film transistor 120 may be disposed below the second buffer layer 114, and the second thin film transistor 130 may be disposed above the second buffer layer 114.

The example embodiments of the present disclosure can also be described as follows.

According to an aspect of the present disclosure, a display apparatus includes a substrate including a first substrate, a second substrate, and an inorganic insulating layer between the first substrate and the second substrate. A first buffer layer is on the substrate, wherein the first buffer layer includes n+1 layers, and 'n' is 0 or an even number. A first thin film transistor, a second thin film transistor, and a storage capacitor are each on the first buffer layer. The first thin film transistor includes a first active layer formed of a low temperature poly silicon material. The second thin film transistor includes a second active layer formed of an oxide semiconductor material. The storage capacitor includes a first capacitor electrode and a second capacitor electrode.

A blocking layer that is an extension of one or both of the first and second capacitor electrodes may overlap the second active layer.

The inorganic insulating layer may be formed of a silicon oxide (SiOx) or silicon nitride (SiNx) material.

Also, 'n' may be 0, and the first buffer layer may be a single layer formed of a silicon oxide (SiOx) or a silicon nitride (SiNx) material.

Also, 'n' may be equal to or larger than 2, and the first buffer layer may be a multi-layer in which a silicon oxide (SiOx) layer and a silicon nitride (SiNx) layer are alternately formed.

The n+1 layers of the first buffer layer may include a lower layer that contacts the substrate and is formed of the silicon oxide (SiOx) material, an upper layer that contacts the first active layer and is formed of the silicon oxide (SiOx) material, and an intermediate layer between the upper layer and the lower layer.

A thickness of the upper layer may be larger than a thickness of the intermediate layer and a thickness of the lower layer.

The thickness of the intermediate layer may be equal to the thickness of the lower layer.

According to another aspect of the present disclosure, a display apparatus includes a substrate, a first buffer layer on the substrate, and a first thin film transistor including: a first active layer formed of a low temperature poly silicon material, a first gate electrode overlapping the first active layer with a first gate insulating layer therebetween, and a first source electrode and a first drain electrode which are electrically connected to the first active layer. A second thin film transistor includes a second active layer formed of an oxide semiconductor, a second gate electrode overlapping the second active layer with a second gate insulating layer therebetween, and a second source electrode and a second drain electrode which are electrically connected to the second active layer. A storage capacitor includes a first capacitor electrode on a same layer as the first gate electrode and a second capacitor electrode overlapping the first capacitor electrode with a first interlayer insulating layer therebetween, and a first blocking layer that is an extension of the second capacitor electrode which overlaps the second active layer.

The substrate may include a first substrate, a second substrate, and an inorganic insulating layer between the first substrate and the second substrate.

A second buffer layer may be between the first blocking layer and the second active layer and have a plurality of layers including a silicon oxide (SiOx) layer and a silicon nitride (SiNx) layer. The second buffer layer may include the silicon oxide (SiOx) layer as an uppermost layer which contacts the second active layer, and at least one silicon nitride (SiNx) layer between the uppermost layer and the first blocking layer.

A second blocking layer may be an extension of the first capacitor electrode which overlaps the second active layer and the first blocking layer.

The second buffer layer may include a second upper buffer layer and a second lower buffer layer, and the second upper buffer layer may be the silicon oxide (SiOx) layer and the second lower buffer layer may be the silicon nitride (SiNx) layer.

The second upper buffer layer may be a silicon dioxide ($SiO_2$) layer.

The first active layer of the first thin film transistor may be on the first buffer layer. The first gate insulating layer may be on the first active layer and the first buffer layer. The first gate electrode of the first thin film transistor and the first capacitor electrode of the storage capacitor may be on the first gate insulating layer. The first interlayer insulating layer may be on the first gate electrode and the first capacitor electrode. The second capacitor electrode of the storage capacitor overlapping the first capacitor electrode and the first blocking layer overlapping the second active layer may be on the first interlayer insulating layer. The second buffer layer may be on the second capacitor electrode, the first blocking layer, and the first interlayer insulating layer. The second active layer of the second thin film transistor may be on the second buffer layer. The second gate insulating layer may be on the second active layer. The second gate electrode of the second thin film transistor may be on the second gate insulating layer. The second interlayer insulating layer may be on the second gate electrode, the second active layer, and the second buffer layer. The first source electrode and the first drain electrode of the first thin film transistor and the second source electrode and the second drain electrode of the second thin film transistor may be on the second interlayer insulating layer.

The second source electrode and the second drain electrode may be electrically connected to the second active layer through a contact hole of the second interlayer insulating layer.

The first source electrode and the first drain electrode may be electrically connected to the first active layer through contact holes of the second interlayer insulating layer, the second buffer layer, the first interlayer insulating layer, and the first gate insulating layer.

A connection electrode on the second interlayer insulating layer may electrically connect the second capacitor electrode of the storage capacitor and the second drain electrode of the second thin film transistor to each other. The connection electrode may be connected to the second drain electrode to be integrally formed.

The connection electrode may be electrically connected to the second capacitor electrode through the contact holes of the second interlayer insulating layer and the second buffer layer.

A connection electrode may be on the second interlayer insulating layer and electrically connect the second capacitor electrode of the storage capacitor and the second drain electrode of the second thin film transistor to each other. The connection electrode may include a second connection electrode integrally connected to the second drain electrode and a first connection electrode which connects the second connection electrode and the second capacitor electrode.

The first connection electrode and the second connection electrode may be electrically connected to the second capacitor electrode through the contact holes of the second interlayer insulating layer and the second buffer layer.

According to another aspect of the present disclosure, a display apparatus includes a substrate, a first buffer layer on the substrate, and a first thin film transistor including: a first active layer formed of a low temperature poly silicon material, a first gate electrode overlapping the first active layer with a first gate insulating layer therebetween, and a first source electrode and a first drain electrode which are electrically connected to the first active layer. A second thin film transistor includes: a second active layer formed of an oxide semiconductor, a second gate electrode overlapping the second active layer with a second gate insulating layer therebetween, and a second source electrode and a second drain electrode which are electrically connected to the second active layer. A storage capacitor includes a first capacitor electrode on a same layer as the first gate electrode and a second capacitor electrode overlapping the first capacitor electrode with a first interlayer insulating layer therebetween. A first blocking layer is an extension of the first capacitor electrode which overlaps the second active layer.

A second blocking layer may be an extension of the second capacitor electrode which overlaps the second active layer and the first blocking layer.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display apparatus, comprising:
   a substrate including:
      a first substrate;
      a second substrate; and
      an inorganic insulating layer between the first substrate and the second substrate;
   a first buffer layer on the substrate, the first buffer layer including n+1 layers, 'n' being 0 or an even number; and
   a first thin film transistor, a second thin film transistor, and a storage capacitor, each on the first buffer layer,
   wherein the first substrate and the second substrate are formed of a plastic,
   wherein the first thin film transistor includes:
      a first active layer formed of a low temperature poly silicon material,
      a first gate electrode overlapping the first active layer, with a first gate insulating layer therebetween, and
      a first source electrode and a first drain electrode, which are electrically connected to the first active layer,
   wherein the second thin film transistor includes:
      a second active layer formed of an oxide semiconductor,
      a second gate electrode overlapping the second active layer, with a second gate insulating layer therebetween, and
      a second source electrode and a second drain electrode, which are electrically connected to the second active layer,
   wherein the storage capacitor includes a first capacitor electrode on a same layer as the first gate electrode and a second capacitor electrode overlapping the first capacitor electrode, with a first interlayer insulating layer therebetween, and
   wherein the first capacitor electrode and the second capacitor electrode are disposed below the second active layer.

2. The display apparatus of claim 1, further comprising a hydrogen blocking layer that is an extension of one or both of the first and second capacitor electrodes, and overlaps the second active layer.

3. The display apparatus according to claim 1, wherein the inorganic insulating layer is formed of a silicon oxide (SiOx) or silicon nitride (SiNx) material.

4. The display apparatus according to claim 1, wherein:
   'n' is 0; and
   the first buffer layer is a single layer formed of a silicon oxide (SiOx) or a silicon nitride (SiNx) material.

5. The display apparatus according to claim 1, wherein:
   'n' is equal to or larger than 2; and
   the first buffer layer is a multi-layer in which a silicon oxide (SiOx) layer and a silicon nitride (SiNx) layer are alternately formed.

6. The display apparatus according to claim 5, wherein the n+1 layers of the first buffer layer include:
   a lower layer that contacts the substrate, and is formed of the silicon oxide (SiOx) material;
   an upper layer that contacts the first active layer, and is formed of the silicon oxide (SiOx) material; and
   an intermediate layer between the upper layer and the lower layer.

7. The display apparatus according to claim 6, wherein a thickness of the upper layer is larger than a thickness of the intermediate layer and a thickness of the lower layer.

8. The display apparatus according to claim 7, wherein the thickness of the intermediate layer is equal to the thickness of the lower layer.

9. A display apparatus, comprising:
   a substrate including a layer formed of a plastic;
   a first buffer layer on the substrate;
   a first thin film transistor including:
      a first active layer formed of a low temperature poly silicon material;
      a first gate electrode overlapping the first active layer, with a first gate insulating layer therebetween; and
      a first source electrode and a first drain electrode, which are electrically connected to the first active layer;
   a second thin film transistor including:
      a second active layer formed of an oxide semiconductor;
      a second gate electrode overlapping the second active layer, with a second gate insulating layer therebetween; and a second source electrode and a second drain electrode, which are electrically connected to the second active layer;

a storage capacitor including a first capacitor electrode on a same layer as the first gate electrode and a second capacitor electrode overlapping the first capacitor electrode, with a first interlayer insulating layer therebetween; and a first hydrogen blocking layer that is an extension of the second capacitor electrode, which overlaps the second active layer.

10. The display apparatus according to claim 9, further comprising:
the substrate including:
a first substrate;
a second substrate; and
an inorganic insulating layer between the first substrate and the second substrate,
wherein the first substrate and the second substrate are formed a plastic.

11. The display apparatus according to claim 10, further comprising:
a second buffer layer between the first hydrogen blocking layer and the second active layer, and having a plurality of layers including a silicon oxide (SiOx) layer and a silicon nitride (SiNx) layer,
wherein the second buffer layer includes the silicon oxide (SiOx) layer as an uppermost layer, which contacts the second active layer, and at least one silicon nitride (SiNx) layer between the uppermost layer and the first hydrogen blocking layer.

12. The display apparatus according to claim 10, further comprising a second hydrogen blocking layer that is an extension of the first capacitor electrode, which overlaps the second active layer and the first hydrogen blocking layer.

13. The display apparatus according to claim 11, wherein:
the second buffer layer includes:
a second upper buffer layer; and
a second lower buffer layer;
the second upper buffer layer is the silicon oxide (SiOx) layer; and
the second lower buffer layer is the silicon nitride (SiNx) layer.

14. The display apparatus according to claim 13, wherein the second upper buffer layer is a silicon dioxide ($SiO_2$) layer.

15. The display apparatus according to claim 11, wherein:
the first active layer of the first thin film transistor is on the first buffer layer;
the first gate insulating layer is on the first active layer and the first buffer layer;
the first gate electrode of the first thin film transistor and the first capacitor electrode of the storage capacitor are on the first gate insulating layer;
the first interlayer insulating layer is on the first gate electrode and the first capacitor electrode;
the second capacitor electrode of the storage capacitor overlapping the first capacitor electrode and the first hydrogen blocking layer overlapping the second active layer are on the first interlayer insulating layer;
the second buffer layer is on the second capacitor electrode, the first hydrogen blocking layer, and the first interlayer insulating layer;
the second active layer of the second thin film transistor is on the second buffer layer;
the second gate insulating layer is on the second active layer;
the second gate electrode of the second thin film transistor is on the second gate insulating layer;
the second interlayer insulating layer is on the second gate electrode, the second active layer, and the second buffer layer; and
the first source electrode and the first drain electrode of the first thin film transistor and the second source electrode and the second drain electrode of the second thin film transistor are on the second interlayer insulating layer.

16. The display apparatus according to claim 15, wherein the second source electrode and the second drain electrode are electrically connected to the second active layer through a contact hole of the second interlayer insulating layer.

17. The display apparatus according to claim 15, wherein the first source electrode and the first drain electrode are electrically connected to the first active layer through contact holes of the second interlayer insulating layer, the second buffer layer, the first interlayer insulating layer, and the first gate insulating layer.

18. The display apparatus according to claim 15, further comprising:
a connection electrode on the second interlayer insulating layer, and electrically connecting the second capacitor electrode of the storage capacitor and the second drain electrode of the second thin film transistor to each other,
wherein the connection electrode is connected to the second drain electrode to be integrally formed.

19. The display apparatus according to claim 18, wherein the connection electrode is electrically connected to the second capacitor electrode through the contact holes of the second interlayer insulating layer and the second buffer layer.

20. The display apparatus according to claim 15, further comprising:
a connection electrode on the second interlayer insulating layer, and electrically connecting the second capacitor electrode of the storage capacitor and the second drain electrode of the second thin film transistor to each other,
wherein the connection electrode includes:
a second connection electrode integrally connected to the second drain electrode, and
a first connection electrode, which connects the second connection electrode and the second capacitor electrode.

21. The display apparatus according to claim 20, wherein the first connection electrode and the second connection electrode are electrically connected to the second capacitor electrode through the contact holes of the second interlayer insulating layer and the second buffer layer.

22. A display apparatus, comprising:
a substrate including a layer formed of a plastic;
a first buffer layer on the substrate;
a first thin film transistor including:
a first active layer formed of a low temperature poly silicon material;
a first gate electrode overlapping the first active layer, with a first gate insulating layer therebetween; and
a first source electrode and a first drain electrode, which are electrically connected to the first active layer;
a second thin film transistor including:
a second active layer formed of an oxide semiconductor;

a second gate electrode overlapping the second active layer, with a second gate insulating layer therebetween; and a second source electrode and a second drain electrode, which are electrically connected to the second active layer;

a storage capacitor including a first capacitor electrode on a same layer as the first gate electrode and a second capacitor electrode overlapping the first capacitor electrode, with a first interlayer insulating layer therebetween; and a first hydrogen blocking layer that is an extension of the first capacitor electrode, which overlaps the second active layer.

23. The display apparatus of claim 22, further comprising a second hydrogen blocking layer that is an extension of the second capacitor electrode, which overlaps the second active layer and the first hydrogen blocking layer.

* * * * *